(12) United States Patent
Yen et al.

(10) Patent No.: US 9,385,756 B2
(45) Date of Patent: Jul. 5, 2016

(54) DATA PROCESSING SYSTEM WITH RETAINED SECTOR REPROCESSING

(75) Inventors: Johnson Yen, Fremont, CA (US);
Shaohua Yang, San Jose, CA (US);
Jefferson E. Singleton, Westminster, CO (US); Bruce Wilson, San Jose, CA (US);
Madhusudan Kalluri, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 622 days.

(21) Appl. No.: 13/490,849

(22) Filed: Jun. 7, 2012

(65) Prior Publication Data

US 2013/0332794 A1 Dec. 12, 2013

(51) Int. Cl.
| | | |
|---|---|---|
| *H03M 13/00* | (2006.01) | |
| *H03M 13/05* | (2006.01) | |
| *H03M 13/11* | (2006.01) | |
| *G11B 20/00* | (2006.01) | |
| *G11B 20/10* | (2006.01) | |
| *G11B 20/18* | (2006.01) | |
| *H03M 13/29* | (2006.01) | |

(52) U.S. Cl.
CPC ............ *H03M 13/1171* (2013.01); *G11B 20/00* (2013.01); *G11B 20/10527* (2013.01); *G11B 20/1883* (2013.01); *H03M 13/2957* (2013.01); *H03M 13/6343* (2013.01)

(58) Field of Classification Search
CPC ............... H03M 13/2957; H03M 13/1102; H03M 13/114; H03M 13/6343; H03M 13/4138; H03M 13/1171; H03M 13/02; H04L 25/03171; G11B 20/10527; G11B 5/012; G11B 20/1883; G06F 3/0659; G06F 3/0676
USPC ......... 714/776, 795, 755, 801, 799, 758, 763; 375/262, 341; 360/53
See application file for complete search history.

(56) References Cited

U.S. PATENT DOCUMENTS 5,274,508 A * 12/1993 Tan et al. .................. 360/48
5,701,314 A   12/1997 Armstrong
(Continued)

OTHER PUBLICATIONS

Olmos et al., "Tree-Structure Expectation Propagation for LDPC Decoding in Erasure Channels", Cornell University Library arXiv:1009.4287 (Sep. 22, 2010).
(Continued)

*Primary Examiner* — Phung M Chung (57) ABSTRACT

A data processing system includes a data input configured to receive input blocks of data, a memory configured to store the input blocks of data, a data processor configured to process the input blocks of data and to yield corresponding processed output blocks of data and a scheduler configured to cause the data processor to output the output blocks of data after a processing criterion has been met in the data processor. The memory is configured to retain the input blocks of data for reprocessing after the corresponding processed output blocks of data have been output from the data processor. The scheduler includes a control input configured to receive reprocessing requests for the retained input blocks of data. The scheduler is configured to initiate a reprocessing operation in the data processor for the retained blocks of data when the reprocessing requests are received on the control input.

20 Claims, 3 Drawing Sheets

(56) References Cited

U.S. PATENT DOCUMENTS

| | | | |
|---|---|---|---|
| 5,712,861 A | 1/1998 | Inoue | |
| 6,438,717 B1 | 8/2002 | Butler | |
| 6,657,803 B1 | 12/2003 | Ling | |
| 7,133,228 B2 * | 11/2006 | Fung et al. | 360/39 |
| 7,136,244 B1 | 11/2006 | Rothberg | |
| 7,386,754 B2 * | 6/2008 | Cronch | 714/5.11 |
| 7,702,989 B2 | 4/2010 | Graef | |
| 7,730,384 B2 | 6/2010 | Graef | |
| 7,738,201 B2 | 6/2010 | Jin | |
| 7,958,427 B1 * | 6/2011 | Yeung et al. | 714/755 |
| 7,971,125 B2 | 6/2011 | Graef | |
| 7,990,642 B2 | 8/2011 | Lee | |
| 8,176,404 B2 | 5/2012 | Yang | |
| 8,826,105 B2 * | 9/2014 | Yen et al. | 714/776 |
| 8,843,807 B1 * | 9/2014 | Stirling et al. | 714/774 |
| 2002/0124227 A1 * | 9/2002 | Nguyen | 714/786 |
| 2006/0053360 A1 | 3/2006 | James | |
| 2008/0046801 A1 * | 2/2008 | Sugitani et al. | 714/801 |
| 2009/0235146 A1 * | 9/2009 | Tan et al. | 714/780 |
| 2011/0080211 A1 | 4/2011 | Yang | |
| 2011/0161633 A1 | 6/2011 | Xu | |
| 2011/0167227 A1 * | 7/2011 | Yang et al. | 711/154 |
| 2011/0185264 A1 * | 7/2011 | Zeng et al. | 714/780 |
| 2012/0200954 A1 | 8/2012 | Jin | |
| 2012/0236429 A1 | 9/2012 | Yang | |

OTHER PUBLICATIONS

U.S. Appl. No. 13/326,363, filed Dec. 15, 2011, Fan Zhang, Unpublished.

U.S. Appl. No. 13/465,214, filed May 7, 2012, Chung-Li Wang, Unpublished.

U.S. Appl. No. 13/445,858, filed Apr. 12, 2012, Johnson Yen, Unpublished.

U.S. Appl. No. 13/474,672, filed May 17, 2012, Fan Zhang, Unpublished.

U.S. Appl. No. 13/412,492, filed Mar. 5, 2012, Shaohua Yang, Unpublished.

U.S. Appl. No. 13/459,282, filed Apr. 30, 2012, Fan Zhang, Unpublished.

U.S. Appl. No. 13/372,600, filed Feb. 14, 2012, Shaohua Yang, Unpublished.

U.S. Appl. No. 13/326,367, filed Dec. 15, 2011, Shaohua Yang, Unpublished.

U.S. Appl. No. 13/483,982, filed May 30, 2012, Yang Han, Unpublished.

Extended EP Search Report of Aug. 11, 2015.

Morita, "Efficiency of Short LDPC Codes Combined With Long Reed-Solomon Codes for Magnetic Recording Channels", IEEE Trans. on Magn., vol. 40, No. 4, Jul. 2004.

* cited by examiner

DATA PROCESSING SYSTEM WITH RETAINED SECTOR REPROCESSING

BACKGROUND

Various data processing systems have been developed for use in applications such as storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of data processors have been developed to detect and correct errors in digital data. For example, data detectors and decoders such as Maximum a Posteriori (MAP) detectors and Low Density Parity Check (LDPC) decoder may be used to detect and decode the values of data bits or multi-bit symbols retrieved from storage or transmission systems.

Sectors of data from storage systems or other blocks of data may vary in the signal to noise ratio (SNR) and thus in the difficulty of recovering the original data after storage or transmission. As data is retrieved or received sequentially, a memory buffer may be provided in a data processing system to store data being processed. However, as processing is completed, the data is kicked out of the memory buffer to make room for new data to be processed. If the data is not successfully processed in the data processing system before the data is kicked out of the memory buffer, the data may be retrieved or received again to repeat the processing in the hope that the processing will be successful the next time.

BRIEF SUMMARY

Various embodiments of the present inventions are related to apparatuses and methods for data processing systems with retained sector reprocessing. The data processing system performs functions such as error detection and correction on blocks of data, and is able to retain data sectors after normal kick-out criteria are reached. Those retained sectors can be reprocessed in the data processing system, in some cases with additional processing resources or time. In some embodiments, the data processing system comprises a read channel for a magnetic hard disk drive, using a Viterbi-type detector and low density parity check (LDPC) decoder to iteratively process data. In such instances, data sectors are generally kicked-out of a central memory if the data converges in the decoder, if the limit on local decoding iterations is reached in the decoder or on global iterations in the detector and decoder, or if the buffer is full and new data is received for processing. The read channel can be instructed to retain certain data sectors in the central memory and reprocessed when the channel has extra bandwidth or when there is spare time, such as when the read head in the hard disk drive is moving between tracks. Retained sectors that are reprocessed can be processed normally in the read channel, or with additional processing resources or time. For example, retry features in the channel or the decoder can be enabled when reprocessing retained sectors, such as Targeted Symbol Flipping (TSF), Y-average, No SyncMark Retry (NSM), etc. The sector can be forwarded to the hard disk controller if it converges during reprocessing, along with a sector tag to identify the sector, and can then be cleared from the central memory.

Control signals are provided in some embodiments of the data processing system, allowing reprocessing of data sectors to be requested and to control whether data sectors are retained in memory in the data processing system after kick out rules would normally clear them from the memory.

This summary provides only a general outline of some embodiments according to the present inventions. Many other objects, features, advantages and other embodiments of the present inventions will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION OF THE INVENTION

Various embodiments of the present inventions are related to apparatuses and methods for data processing systems with retained sector reprocessing. The data processing system performs functions such as error detection and correction on blocks of data, and is able to retain data sectors after normal kick-out criteria are reached. Those retained sectors can be reprocessed in the data processing system, in some cases with additional processing resources or time. In some embodiments, the data processing system comprises a read channel for a magnetic hard disk drive, using a Viterbi-type detector and low density parity check (LDPC) decoder to iteratively process data. In such instances, data sectors are generally kicked-out of a central memory if the data converges in the decoder, if the limit on local decoding iterations is reached in the decoder or on global iterations in the detector and decoder, or if the buffer is full and new data is received for processing. The read channel can be instructed to retain certain data sectors in the central memory and reprocessed when the channel has extra bandwidth or when there is spare time, such as when the read head in the hard disk drive is moving between tracks. Retained sectors that are reprocessed can be processed normally in the read channel, or with additional processing resources or time. For example, retry features in the channel or the decoder can be enabled when reprocessing retained sectors, such as Targeted Symbol Flipping (TSF), Y-average, No SyncMark Retry (NSM), etc. The sector can be forwarded to the hard disk controller if it converges during reprocessing, along with a sector tag to identify the sector, and can then be cleared from the central memory.

Control signals are provided in some embodiments of the data processing system, allowing reprocessing of data sectors to be requested and to control whether data sectors are retained in memory in the data processing system after kick out rules would normally clear them from the memory.

The data processing system with retained sector reprocessing disclosed herein is applicable to processing data stored in or transmitted over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives. For example, the data processing system may be, but is not limited to, a read channel in a magnetic hard disk drive, detecting and decoding data sectors from the drive.

The term "sector" is used herein with respect to several example embodiments, but may be considered to refer generally to a block of data processed in a data processing system with retained sector reprocessing, regardless of the source or format of the data.

Figure 1:
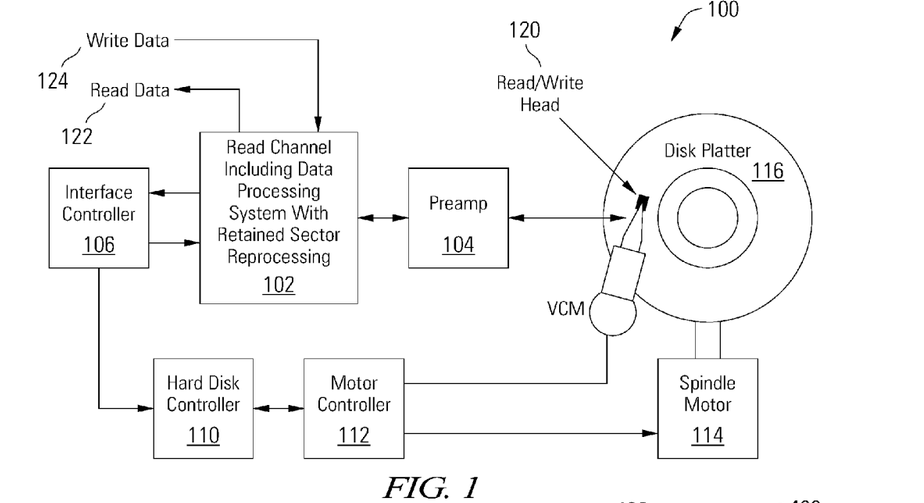
FIG. 1 depicts a storage system including a data processing system with retained sector reprocessing in accordance with some embodiments of the present inventions.
Figure 2:
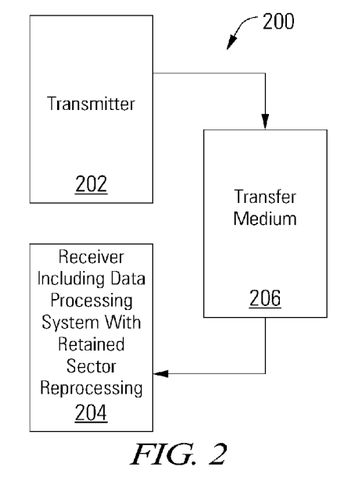
FIG. 2 depicts a wireless communication system including a data processing system with retained sector reprocessing in accordance with some embodiments of the present inventions.

Although the data processing system with retained sector reprocessing disclosed herein is not limited to any particular application, several examples of applications are presented in FIGS. 1 and 2 that benefit from embodiments of the present inventions. Turning to FIG. 1, a storage system 100 is illustrated as an example application of a data processing system with retained sector reprocessing in accordance with some embodiments of the present inventions. The storage system 100 includes a read channel circuit 102 with a data processing system with retained sector reprocessing in accordance with some embodiments of the present inventions. Storage system 100 may be, for example, a hard disk drive. Storage system 100 also includes a preamplifier 104, an interface controller 106, a hard disk controller 110, a motor controller 112, a spindle motor 114, a disk platter 116, and a read/write head assembly 120. Interface controller 106 controls addressing and timing of data to/from disk platter 116. The data on disk platter 116 consists of groups of magnetic signals that may be detected by read/write head assembly 120 when the assembly is properly positioned over disk platter 116. In one embodiment, disk platter 116 includes magnetic signals recorded in accordance with either a longitudinal or a perpendicular recording scheme.

In a typical read operation, read/write head assembly 120 is accurately positioned by motor controller 112 over a desired data track on disk platter 116. Motor controller 112 both positions read/write head assembly 120 in relation to disk platter 116 and drives spindle motor 114 by moving read/write head assembly 120 to the proper data track on disk platter 116 under the direction of hard disk controller 110. Spindle motor 114 spins disk platter 116 at a determined spin rate (RPMs). Once read/write head assembly 120 is positioned adjacent the proper data track, magnetic signals representing data on disk platter 116 are sensed by read/write head assembly 120 as disk platter 116 is rotated by spindle motor 114. The sensed magnetic signals are provided as a continuous, minute analog signal representative of the magnetic data on disk platter 116. This minute analog signal is transferred from read/write head assembly 120 to read channel circuit 102 via preamplifier 104. Preamplifier 104 is operable to amplify the minute analog signals accessed from disk platter 116. In turn, read channel circuit 102 decodes and digitizes the received analog signal to recreate the information originally written to disk platter 116. This data is provided as read data 122 to a receiving circuit. As part of decoding the received information, read channel circuit 102 processes the received signal using a data processing system with out of order transfer. Such a data processing system with retained sector reprocessing may be implemented consistent with that disclosed below in relation to FIGS. 3 and 4. In some cases, the data processing may be performed consistent with the flow diagram disclosed below in relation to FIG. 5. A write operation is substantially the opposite of the preceding read operation with write data 124 being provided to read channel circuit 102. This data is then encoded and written to disk platter 116.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 2, a wireless communication system 200 or data transmission device including a receiver 204 with a data processing system with retained sector reprocessing is shown in accordance with some embodiments of the present inventions. Communication system 200 includes a transmitter 202 that is operable to transmit encoded information via a transfer medium 206 as is known in the art. The encoded data is received from transfer medium 206 by receiver 204. Receiver 204 incorporates a data processing system with out of order transfer. Such a data processing system with retained sector reprocessing may be implemented consistent with that described below in relation to FIGS. 3 and 4. In some cases, the data processing may be done consistent with the flow diagram discussed below in relation to FIG. 5.

Figure 3:
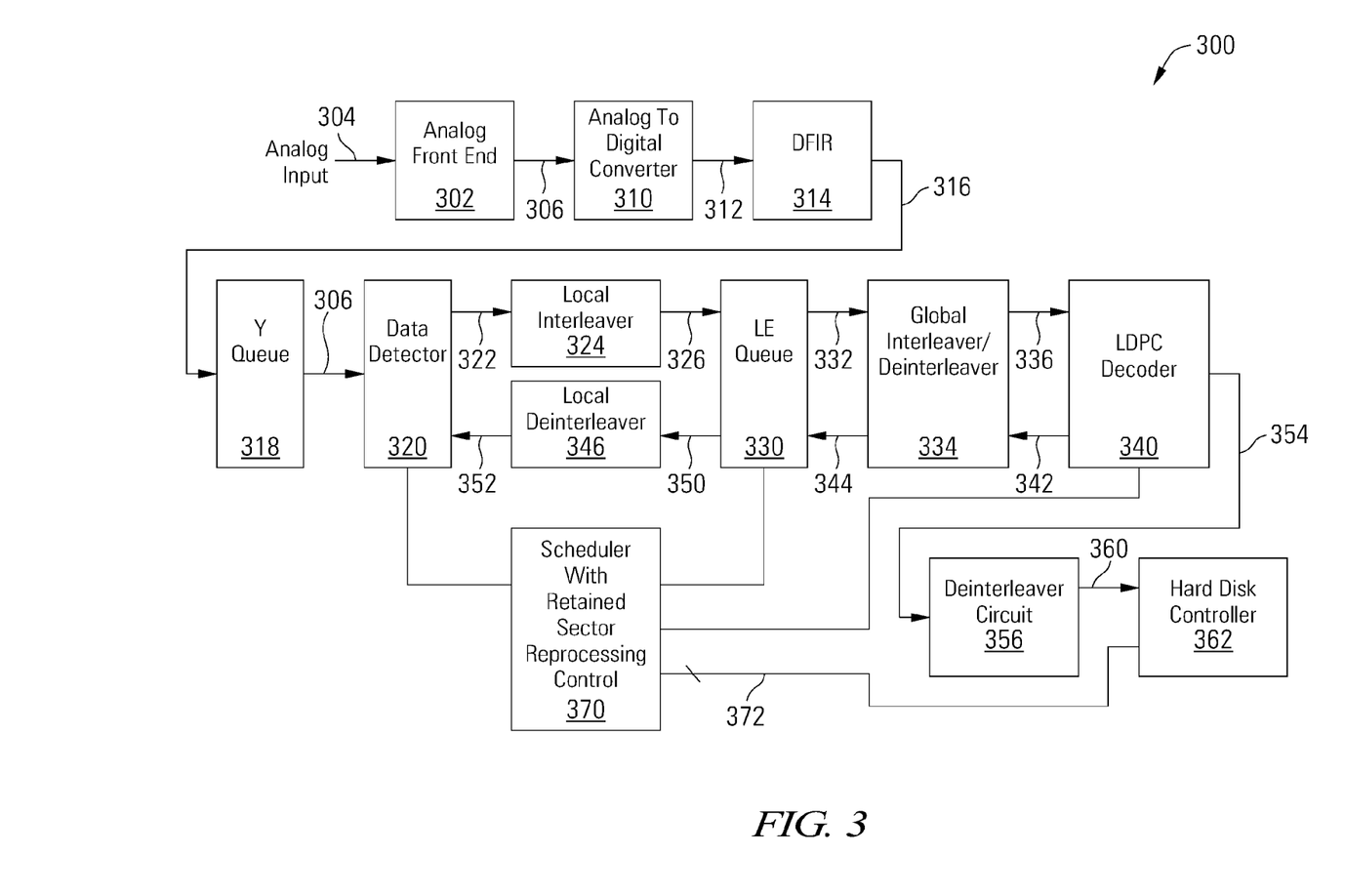
FIG. 3 depicts a block diagram of a data processing system with retained sector reprocessing in accordance with some embodiments of the present inventions.

Turning to FIG. 3, a data processing system 300 with retained sector reprocessing is depicted in accordance with one or more embodiments of the present inventions. Data processing system 300 includes an analog front end circuit 302 that receives an analog signal 304. Analog front end circuit 302 processes analog signal 304 and provides a processed analog signal 306 to an analog to digital converter circuit 310. Analog front end circuit 302 may include, but is not limited to, an analog filter and an amplifier circuit as are known in the art. Based upon the disclosure provided herein, one of ordinary skill in the art will recognize a variety of circuitry that may be included as part of analog front end circuit 302. In some cases, analog signal 304 is derived from a read/write head assembly (e.g., 120) that is disposed in relation to a storage medium (e.g., 116). In other cases, analog signal 304 is derived from a receiver circuit (e.g., 204) that is operable to receive a signal from a transmission medium (e.g., 206). The transmission medium may be wired or wireless. Based upon the disclosure provided herein, one of ordinary skill in the art will recognize a variety of sources from which analog input 304 may be derived.

Analog to digital converter circuit 310 converts processed analog signal 306 into a corresponding series of digital samples 312. Analog to digital converter circuit 310 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present inventions. Digital samples 312 are provided to an equalizer circuit 314. Equalizer circuit 314 applies an equalization algorithm to digital samples 312 to yield an equalized output 316. In some embodiments of the present inventions, equalizer circuit 314 is a digital finite impulse response filter circuit as are known in the art. In some cases, equalizer 314 includes sufficient memory to maintain one or more codewords until a data detector circuit 320 is available for processing. It may be possible that equalized output 316 may be received directly from a storage device in, for example, a solid state storage system. In such cases, analog front end circuit 302, analog to digital converter circuit 310 and equalizer circuit 314 may be eliminated where the data is received as a digital data input.

Data detector circuit 320 is operable to apply a data detection algorithm to a received codeword or data set, and in some cases data detector circuit 320 can process two or more codewords in parallel. In some embodiments of the present inventions, data detector circuit 320 is a Viterbi algorithm data detector circuit as is known in the art. In other embodiments of the present inventions, data detector circuit 320 is a maximum a posteriori data detector circuit as is known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present inventions. Data detector circuit 320 is started based upon availability of a data set from equalizer circuit 314 or from a central memory circuit 330.

Upon completion, data detector circuit 320 provides detector output 322. Detector output 322 includes soft data. As used herein, the phrase "soft data" is used in its broadest sense to mean reliability data with each instance of the reliability data indicating a likelihood that a corresponding bit position or group of bit positions has been correctly detected. In some embodiments of the present inventions, the soft data or reliability data is log likelihood ratio data as is known in the art. Detected output 322 is provided to a local interleaver circuit 324. Local interleaver circuit 324 is operable to shuffle sub-portions (i.e., local chunks) of the data set included as detected output 322 and provides an interleaved codeword 326 that is stored to central memory circuit 330. Interleaver circuit 324 may be any circuit known in the art that is capable of shuffling data sets to yield a re-arranged data set. Interleaved codeword 326 is stored to central memory circuit 330. The interleaved codeword 326 is accessed from central memory circuit 330 as a stored codeword 332 and globally interleaved by a global interleaver/de-interleaver circuit 334. Global interleaver/De-interleaver circuit 334 may be any circuit known in the art that is capable of globally rearranging codewords. Global interleaver/De-interleaver circuit 334 provides a decoder input 336 to a low density parity check (LDPC) decoder 340. Based upon the disclosure provided herein, one of ordinary skill in the art will recognize other decode algorithms that may be used in relation to different embodiments of the present inventions. The LDPC decoder 340 applies a data decode algorithm to decoder input 336 in a variable number of local iterations.

Where the LDPC decoder 340 fails to converge (i.e., fails to yield the originally written data set) and a number of local iterations through LDPC decoder 340 exceeds a threshold, the resulting decoded output is provided as a decoded output 342 back to central memory circuit 330 where it is stored awaiting another global iteration through data detector circuit 320 and LDPC decoder 340. Multiple sectors may be processed simultaneously in the data processing system 300, with additional sectors being admitted to the data detector 320 as other sectors converge in the LDPC decoder 340 and are output and cleared from the Y queue 318 and LE queue 330.

Prior to storage of decoded output 342 to central memory circuit 330, decoded output 342 is globally de-interleaved to yield a globally de-interleaved output 344 that is stored to central memory circuit 330. The global de-interleaving reverses the global interleaving earlier applied to stored codeword 332 to yield decoder input 336. Once data detector circuit 320 is available, a previously stored de-interleaved output 344 is accessed from central memory circuit 330 and locally de-interleaved by a de-interleaver circuit 346. De-interleaver circuit 346 rearranges decoder output 350 to reverse the shuffling originally performed by interleaver circuit 324. A resulting de-interleaved output 352 is provided to data detector circuit 320 where it is used to guide subsequent detection of a corresponding data set received as equalized output 316.

Alternatively, where the decoded output converges (i.e., yields the originally written data set) in the non-binary LDPC decoder 340, the resulting decoded output is provided as an output codeword 354 to a de-interleaver circuit 356. De-interleaver circuit 356 rearranges the data to reverse both the global and local interleaving applied to the data to yield a de-interleaved output 360. De-interleaved hard decision output 360 is provided to controller 362. In some embodiments, controller 362 is a hard disk controller circuit which initiates read operations of a magnetic storage device and which receives the resulting data and provides it to an external device such as a general purpose computer system. In some embodiments, the hard disk controller 362 is a component external to the read channel 300 and may be considered to be a separate element in communication with the read channel 300.

A scheduler 370 with retained sector reprocessing control is used to schedule data flow through the detector 320 and LDPC decoder 340 and through internal memory queue 330 in the data processing system 330, for example by allocating the position of each codeword being detected and decoded and by managing the maximum number of local and global iterations performed, and providing status about output data on control signals 372.

In some embodiments, the scheduler 370 is operable to flexibly provide different processing power for different data blocks or sectors. The scheduler 370 assigns different priority levels to the sectors during processing based on the input control signals 372 as well as other factors such as power management schemes and sector operating metrics. The scheduler 370 allocates resources in the data processing system 300, provides different levels of processing capabilities to the sectors according to the priority level. For example, the scheduler 370 may control the number of LDPC decoding iterations, retry features such as Y-average, Targeted Symbol Flipping (TSF), No SyncMark Retry (NSM), etc. Such retry features may be initiated by the scheduler 370 based on diagnostic metrics such as the number of unsatisfied parity checks in the LDPC decoder 340, and on the operating mode, e.g., normal processing versus reprocessing.

With respect to FIG. 3, the term data processing system is used to refer to the entire illustrated read channel from analog input 304 to hard decision output 360 provided to hard disk controller 362. However, a data processing system with retained sector reprocessing is not limited to this example application. More generally, the data processing system with retained sector reprocessing may comprise any device or system for processing data in any manner which can retain data sectors for reprocessing. In some embodiments, the data processing system with retained sector reprocessing also includes provides a control interface enabling a controller such as hard disk controller 362 to request reprocessing of retained sectors and to instruct the scheduler 370 to retain specific sectors.

The scheduler 370 implements kick out rules to control when a data sector is output to the hard disk controller 362 and when a data sector is cleared from the central memory circuit 330. In some embodiments, data sectors are kicked out of (or output from) central memory circuit 330 to hard disk controller 362 when the data sector converges in the LDPC decoder 340, or when the limit on local decoding iterations is reached in the LDPC decoder 340, or when the limit on global iterations is reached in the data detector 320 and the LDPC decoder 340, or if the central memory circuit 330 is full and new data is received for processing at analog input 304. In some embodiments, a data sector converges when it settles on values during decoding iterations for which parity checks are satisfied. The kick out rules that limit on local and global decoding iterations may be hard-coded in scheduler 370, or may be programmable, for example using registers such as a MAX_LOCAL register to set the maximum number of local decoding iterations and a MAX_GLOBAL register to set the maximum number of global detecting and decoding iterations.

The scheduler 370 also implements kick out rules to be applied during reprocessing operations, which may allocate additional time and/or processing resources or techniques. In some embodiments, the scheduler 370 is hard-coded or is programmable with customized kick out rules, for example using registers such as an RSR_MAX_LOCAL register to set the maximum number of local decoding iterations during reprocessing and an RSR_MAX_GLOBAL register to set the maximum number of global detecting and decoding iterations during reprocessing, as well as enabling retry features such as Y-average, Targeted Symbol Flipping, and/or No SyncMark Retry NSM during reprocessing. Based upon the disclosure provided herein, one of ordinary skill in the art will recognize a variety of circuitry or code that may be included in scheduler 370 to retain sectors as commanded by hard disk controller 362 and to apply different kick out criteria and to allocate additional processing resources while reprocessing retained sectors.

Data sectors can thus be retained in the central memory circuit 330 by the scheduler 370, as requested by the hard disk controller 362, after the normal kick out criteria are reached. Those retained sectors can be reprocessed with additional local and/or global decoding iterations when the read channel 300 has extra bandwidth or when there is spare time between read operations, for example when the read head 120 is moving between data tracks on disk platter 116.

Retained sector reprocessing enables the read channel 300 to achieve signal to noise ratio (SNR) gains by running more local and/or global iterations on a slow-converging sector. Further SNR gains can be achieved by combining reprocessing of retained sectors with other retry features. System access time can be reduced by skipping automatic retry operations on a decoding-failed sector in the LDPC decoder 340 and allowing the hard disk controller 362 to determine when reprocessing should be performed. Time consuming retry features in the LDPC decoder 340 may thus be delayed until the system has extra bandwidth or idle time. In some embodiments, sectors are received, processed and kicked out of the read channel 300 in order, simplifying the design of the read channel 300, while still providing for reprocessing of difficult sectors when the system might otherwise be idle. Reprocessed sectors can be forwarded to the hard disk controller 362 immediately with a sector tag to release buffer space in central memory circuit 330 after they converge with longer iteration processing or with retry features. This can release memory space in central memory circuit 330 in the read channel 300 earlier for other incoming data sectors, reducing overall latency.

Figure 4:
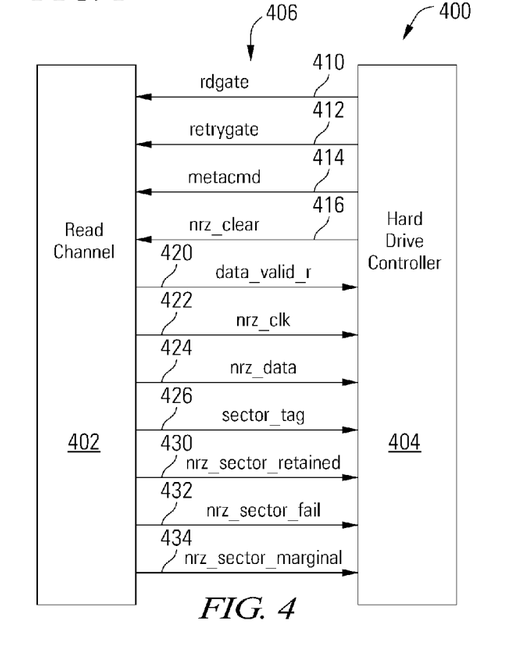
FIG. 4 depicts input/output (I/O) ports and connections between a read channel and a hard disk controller in an example data processing system with retained sector reprocessing in accordance with some embodiments of the present inventions.

Turning to FIG. 4, an example data processing system 400 is depicted which includes a read channel 402 and a hard disk controller 404 in accordance with some embodiments of the present inventions. An external host (not shown) may communicate with the hard disk controller 404, requesting data that has been stored on a magnetic storage device. The hard disk controller 404 instructs the read channel 402 to detect and decode sectors containing the data. The hard disk controller 404 may also specify sectors that should be retained, if possible, after processing, and which should not, as well as to request reprocessing of retained sectors when extra bandwidth is available or when time allows, such as when a read head 120 is moving between tracks on a disk platter 116. In some embodiments, these instructions also trigger the sensing of magnetic signals on a disk platter by a read/write head assembly as disclosed above with respect to FIG. 1.

When sectors have been detected and decoded by the read channel 402, they are transmitted to the hard disk controller 404 along with signals that tag the sectors as they are transmitted, identifying them. Some of the control signals 406 that may be used between the read channel 402 and the hard disk controller 404 are shown in FIG. 4 in accordance with some embodiments of the present inventions. The hard disk controller 404 instructs the read channel 402 to perform a read operation with normal processing using a rdgate signal 410. The read channel 402 may perform processing functions such as those disclosed above to detect and decode data sectors. The hard disk controller 404 instructs the read channel 402 to reprocess the retained sector that was read last, using a retrygate signal 412, which may also cause additional processing time and techniques to be applied while reprocessing the retained sector.

In some embodiments, all sectors read using the rdgate signal 410 are eligible to be retained in read channel 402 after normal processing, unless the hard disk controller 404 asserts the metacmd signal 414 along with the rdgate signal 410 to indicate that the sector is non-retainable inside the read channel 402. For example, the hard disk controller 404 may identify a sector as non-retainable if it is a speculative read, a read-ahead operation for a sector that is likely to be requested soon. In the case of speculative reads, the hard disk controller 404 will specify that the sector not be retained, to allow actual data read operations to take precedence over speculative reads. The hard disk controller 404 may also assert an nrz_clear signal 416 after receiving a data sector, instructing the read channel 402 to clear the last sector from memory after it is determined in the hard disk controller 404 that the sector will not be reprocessed. The hard disk controller 404 may use the nrz_clear signal 416 to flush the read channel 402, making room in memory to read other sectors.

When a data sector has been processed by the read channel 402, for example when the data values for the sector have converged in a decoder and parity checks are satisfied, the read channel 402 transmits the data to the hard disk controller 404. A data_valid_r signal 416 from the read channel 402 to the hard disk controller 404 indicates that valid data is being transmitted.

When a sector has been detected and decoded by the read channel 402 in response to the rdgate signal 410 or the retrygate signal 412, and a corresponding kick out criteria has been met, for example when the data values for the sector have converged in a decoder and parity checks are satisfied, the sector is transferred to the hard disk controller 404. Sectors are transferred from the read channel 402 to the hard disk controller 404 using an nrz_data signal 424 to transmit the data, an nrz_clk signal 422 to clock the data, and a data_valid_r signal 420 to indicate that the data on nrz_data signal 424 is valid. In some embodiments, data sectors are transferred in non-return to zero format. A sector_tag signal 426 from the read channel 402 to the hard disk controller 404 may be used to identify the sector being transferred. Sectors may be identified in any suitable manner, such as by sector number. The control signals 406 may also include status signals indicating whether the processed sectors passed the parity checks or other error checks after processing. In some embodiments, the read channel 402 transfers sectors to the hard disk controller 404 in the order they were requested and read, that is, read channel 402 sequentially transfers the sector data with associated flags to the hard disk controller 404 according to the sequence of rdgate commands regardless of decoding convergence results.

When a sector fails to converge, the read channel 402 determines whether the sector can be retained in the buffer for reprocessing, based on whether the metacmd signal 414 was asserted during the rdgate signal 410 for the sector, and whether there is sufficient space in the buffer. If the read channel 402 decides to retain the failed sector in the buffer, then an nrz_sector_retained signal 430 is asserted while the sector is transferred from the read channel 402 to the hard disk controller 404. An nrz_sector_fail signal 432 or nrz_sector_marginal signal 434 may also be asserted during the transfer, providing metrics about the decoding status for the sector to the hard disk controller 404. For example, the nrz_sector_fail signal 432 is asserted during the transfer if the sector failed to converge. The nrz_sector_marginal signal 434 is asserted during the transfer if the sector did not converge perfectly, for example if the number of parity check violations was greater than zero but with a predetermined range. The sector is retained if it meets the criterion disclosed above, staying in the buffer until the hard disk controller 404 issues the retrygate signal 412 to initiate a reprocessing operation, or the nrz_clear signal 416 is asserted by the hard disk controller 404 to flush the sector from the buffer. In some embodiments, the retained sector may eventually be cleared from the buffer by the read channel 402 if the space is needed to process other sectors in response to rdgate commands, even if the hard disk controller 404 does not issue the retrygate signal 412 for the retained sector. The number of sectors to retain may be based on the available space in the buffer in the read channel 402, or may also be limited to a predetermined number of sectors, based on the size of the buffer and of each sector.

The signals from the hard disk controller 404 to the read channel 402 may be combined or transmitted using other mechanisms, such as a bus. The signals may be unidirectional or bidirectional. For example, the nrz_clk signal 422 may be generated in either the read channel 402 or the hard disk controller 404 and used to synchronize other signals in both directions between the read channel 402 and the hard disk controller 404, or separate clock signals may be used between the read channel 402 and hard disk controller 404.

Figure 5:
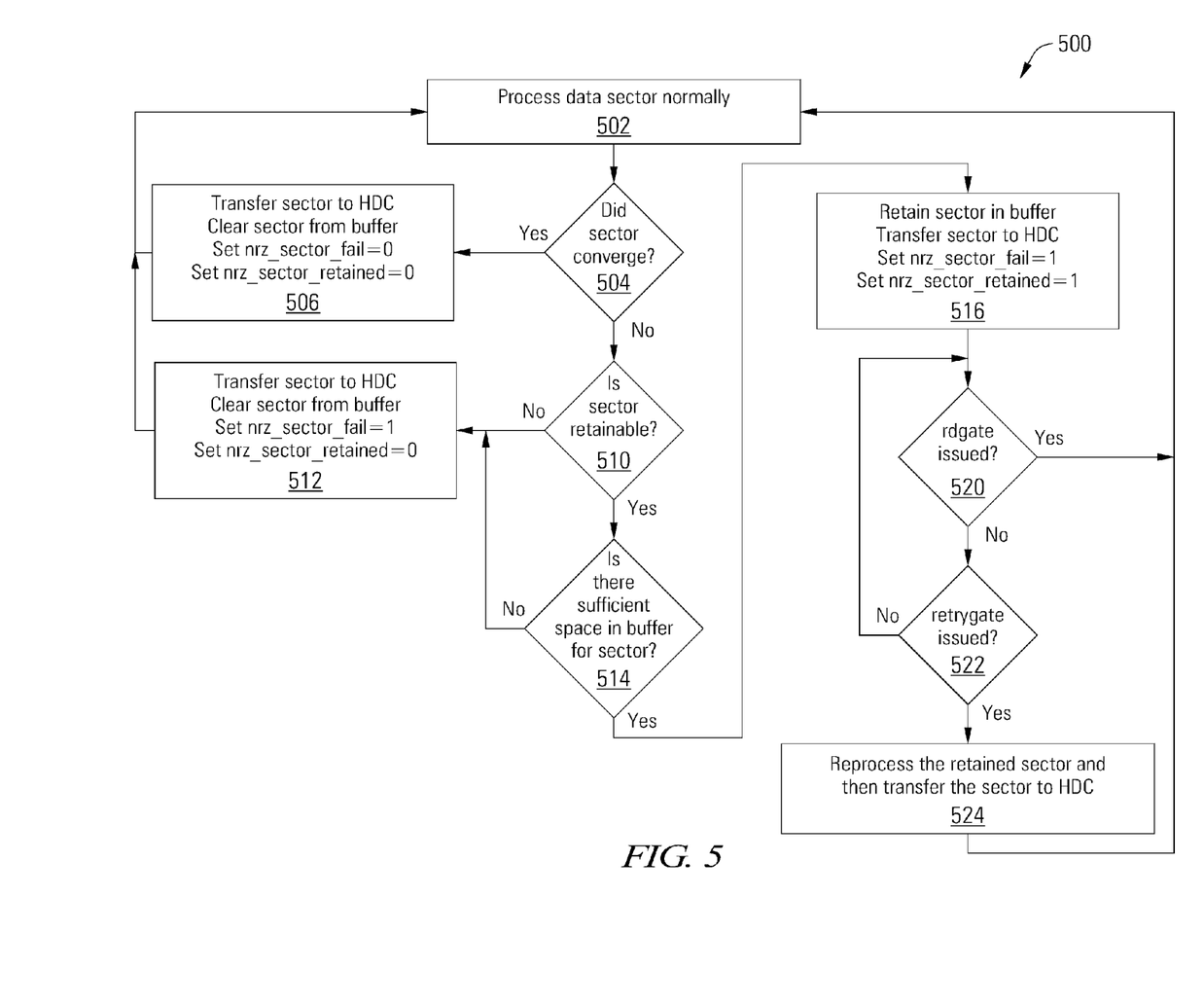
FIG. 5 depicts a flow diagram showing a method for data processing with retained sector reprocessing in accordance with some embodiments of the present inventions.

Turning to FIG. 5, a flow diagram 500 depicts a method for processing data in a data processing system with retained sector reprocessing in accordance with some embodiments of the present inventions. The method of FIG. 5 may be performed, for example by circuits such as those disclosed in FIGS. 3 and 4. Following flow diagram 500, a data sector is first processed normally. (Block 502). A read request for the data sector from a hard disk controller to a read channel may be used to initiate the read operation and the processing of the data sector, for example using a rdgate signal. Normal processing may comprise, for example, detection in a Viterbi or MAP-type detector and decoding in an LDPC decoder in a read channel. A determination is made as to whether the sector converged. (Block 504) If so, the sector is transferred to the hard disk controller, the sector is cleared from a buffer in the read channel, the nrz_sector_fail signal 432 is set to 0 to indicate that the sector converged, and the nrz_sector_retained signal 430 is set to 0 to indicate that the sector has been cleared from the buffer. (Block 506) If the sector did not converge, a determination is made as to whether the sector is retainable in the buffer of the read channel. (Block 510) For example, if the metacmd signal 414 was asserted by the hard disk controller 404 during the rdgate signal 410 for the sector, the sector is not retainable. If the sector is not retainable, the sector is transferred to the hard disk controller 404, the sector is cleared from a buffer in the read channel, the nrz_sector_fail signal 432 is set to 1 to indicate that the sector did not converge, and the nrz_sector_retained signal 430 is set to 0 to indicate that the sector has been cleared from the buffer. (Block 512)

If the sector did not converge (block 504) and is retainable (block 510), a determination is made as to whether there is sufficient space in the buffer for the sector. (Block 514) This determination may be based on the free space left in the buffer, and in some embodiments on whether a limit on the number of sectors in the buffer has already been reached. If there is not sufficient space, the sector is transferred to the hard disk controller 404, the sector is cleared from a buffer in the read channel, the nrz_sector_fail signal 432 is set to 1 to indicate that the sector did not converge, and the nrz_sector_retained signal 430 is set to 0 to indicate that the sector has been cleared from the buffer. (Block 512) Processing then continues with other sectors. (Block 502)

If there is sufficient space in the buffer for the sector (block 514), the sector is retained in the buffer, the sector that failed to converge is transferred to the hard disk controller 404, the nrz_sector_fail signal 432 is set to 1 to indicate that the sector did not converge, and the nrz_sector_retained signal 430 is set to 1 to indicate that the sector has been retained in the buffer. (Block 516) If, during this process, a rdgate signal 410 is asserted for another sector (block 520), processing continues for that sector. (Block 502) While the original sector that failed to converge is still retained in the buffer, if the retrygate signal is asserted for the sector (block 522), the retained sector is reprocessed and then transferred to the hard disk controller. (Block 524)

In some embodiments, in which sectors are transferred in order, the retrygate signal 412 refers to the last sector to be transferred. In other embodiments, the hard disk controller 404 may identify the retained sector to be reprocessed when the retrygate signal 412 is asserted.

Notably, the order in which the steps of FIG. 5 are performed is not limited to that shown, and steps may be performed in parallel.

In some embodiments, the retrygate signal 412 may be issued more than once for a retained sector, with operating characteristics of the read channel being adjusted between each reprocessing operation in an attempt to correctly decode the sector.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

The retained sector reprocessing disclosed herein enables troublesome data sectors to receive greater processing resources than normal when bandwidth and processing resources are available, while kicking out some sectors more quickly than would otherwise be the case to reduce overall latency. By allocating space in the central memory circuit for retained sectors, the hard drive controller can request additional processing of a sector without having to repeat an entire read operation which would reread the data from the hard disk.

In conclusion, the present invention provides novel apparatuses, systems, and methods for a data processing system with retained sector reprocessing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
a data input configured to receive input blocks of data;
a memory configured to store the input blocks of data;
a data processor configured to process the input blocks of data and to yield corresponding processed output blocks of data; and
a scheduler configured to cause the data processor to output the output blocks of data after kick out rules have been satisfied in the data processor, and wherein the memory is configured to retain the input blocks of data for reprocessing after the corresponding processed output blocks of data have been output from the data processor, the scheduler comprising a control input configured to receive reprocessing requests for the retained input blocks of data, wherein the scheduler is configured to initiate a reprocessing operation in the data processor for the retained blocks of data when the reprocessing requests are received on the control input.

2. The data processing system of claim 1, wherein the data processor comprises a data detector and a low density parity check decoder configured to iteratively detect data values in the blocks of data.

3. The data processing system of claim 1, wherein the kick out rules in the schedular comprise convergence of one of the output blocks of data and comprise a limit on processing iterations.

4. The data processing system of claim 1, wherein the scheduler is configured to allocate more processing resources in the data processor when reprocessing the blocks of data than when processing the blocks of data.

5. The data processing system of claim 4, wherein the processing resources comprise a number of processing iterations and at least one retry processing operation.

6. The data processing system of claim 1, wherein the scheduler is further configured to receive read requests for the blocks of data.

7. The data processing system of claim 1, wherein the data processor is configured to transfer the processed output blocks of data to a hard disk controller after processing to determine whether corresponding blocks of data are retainable, and to retain the corresponding blocks of data if retainable.

8. The data processing system of claim 7, wherein the data processor is further configured to transfer an indication to the hard disk controller of whether the corresponding blocks of data are retained.

9. The data processing system of claim 1, wherein the data processing system is incorporated in a storage device.

10. The data processing system of claim 1, wherein the data processing system comprises a read channel, and wherein the read channel comprises a rdgate input and a retrygate input, wherein the read channel is configured to perform a read operation for one of the input blocks of data with normal processing when signaled by the rdgate input, and to reprocess a retained one of the input blocks of data when signaled by the retrygate input.

11. The data processing system of claim 10, wherein the data processing system comprises a read channel, and wherein the read channel comprises a metacmd input, and wherein the read channel is configured to determine whether one of the input blocks of data can be retained for reprocessing based on whether the metacmd input was asserted when the rdgate input was asserted for the input block of data and on whether sufficient space is available for the input block of data in the memory.

12. The data processing system of claim 1, wherein the data processing system comprises a read channel, and wherein the read channel comprises a sector retained output, wherein the read channel is configured to assert the sector retained output when outputting one of the processed output blocks of data when a corresponding one of the input blocks is retained in the memory.

13. The data processing system of claim 1, wherein the data processing system comprises a read channel, and wherein the read channel comprises a sector_marginal output and a sector_fail output, wherein the read channel is configured to assert the sector_marginal output when outputting one of the processed output blocks of data when a number of parity check violations for the processed output block is greater than zero and within a predetermined range, and wherein the read channel is configured to assert the sector_fail output when outputting one of the processed output blocks of data when the processed output block failed to converge.

14. A method for processing data, comprising:
  receiving a data sector at an input to a data processing system;
  storing the data sector in a memory in the data processing system;
  processing the data sector to detect data values when a read request is received by the data processing system;
  outputting the data values for the data sector from the data processing system;
  determining whether to retain the data sector in the memory based at least in part on a retention instruction received with the read request;
  outputting an indication of whether the data sector was retained from the data processing system;
  reprocessing the data sector to generate new data values when a reprocessing request is received for the data sector; and
  outputting the new data values from the data processing system.

15. The method of claim 14, further comprising outputting an indication of whether the data values were successfully detected when outputting the data values for the data sector.

16. The method of claim 14, further comprising determining whether the memory has sufficient free space to retain the data sector.

17. The method of claim 14, wherein processing the data sector comprises decoding the data sector in a low density parity check decoder up to a predetermined number of iterations until the data sector converges.

18. The method of claim 17, wherein reprocessing the data sector comprises decoding the data sector in the low density parity check decoder up to a larger second predetermined number of iterations until the data sector converges.

19. The method of claim 18, wherein reprocessing the data sector further comprises performing at least one retry operation in the low density parity check decoder.

20. A storage system comprising:
  a storage medium maintaining a data set;
  a read/write head assembly configured to sense the data set on the storage medium and to provide an analog output corresponding to the data set;
  an analog to digital converter configured to sample an analog signal derived from the analog output to yield a digital output;
  a controller configured to control read operations in the storage system; and
  a data processing system comprising:
  a data processor configured to process blocks of data in the digital output and to output corresponding processed blocks of data to the controller, and to retain the blocks of data for reprocessing when a reprocessing request is received by the data processing system from the controller; and
  a scheduler configured to receive reprocessing requests for the retained blocks of data from the controller and to initiate a reprocessing operation in the data processor for the retained blocks of data.

* * * * *